(12) United States Patent
Unsworth et al.

(10) Patent No.: US 6,636,823 B1
(45) Date of Patent: Oct. 21, 2003

(54) METHOD AND APPARATUS FOR MOTOR FAULT DIAGNOSIS

(75) Inventors: Peter J. Unsworth, Lewes (GB); Muslum Arkan, Gaziantep (TR)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/409,452

(22) Filed: Sep. 30, 1999

(51) Int. Cl.⁷ .......................... G01R 31/00; G06F 19/00
(52) U.S. Cl. .......................... 702/115; 702/58; 702/60; 324/76.24
(58) Field of Search .................. 702/115, 58–59, 702/60, 62, 72, 77, 126; 324/545, 546, 76.21, 76.24; 363/2–4

(56) References Cited

U.S. PATENT DOCUMENTS

| | | | | |
|---|---|---|---|---|
| 5,428,549 A | * | 6/1995 | Chen | 361/80 |
| 5,567,994 A | * | 10/1996 | Davis et al. | 307/105 |
| 5,786,708 A | * | 7/1998 | Premerlani et al. | 324/545 |
| 6,144,924 A | * | 11/2000 | Dowling et al. | 702/60 |
| 6,172,509 B1 | * | 1/2001 | Cash et al. | 318/434 |

OTHER PUBLICATIONS

A New Approach to On–Line Turn Fault Detection in AC Motors, GB. Kliman, W.J. Premerlani, R.A. Koegl & D. Hoeweler, General Electric Corporate R&D paper, pp. 687–693, 1996.

* cited by examiner

Primary Examiner—Bryan Bui
(74) Attorney, Agent, or Firm—Amin & Turocy, LLP; Alexander M. Gerasimow; William R. Walbrun

(57) ABSTRACT

A method and apparatus for detecting a stator winding fault in an induction motor includes sampling instantaneous signals from the motor and then deriving sequence components of at least some of the instantaneous signals using a power decomposition technique (PDT), one of the sequence components being a total negative sequence current component. In addition, the method includes calculating an expected negative sequence current based on at least some of the sequence components. Thereafter, the method subtracts the expected negative sequence current from the total negative sequence current to determine a fault negative sequence current, wherein the fault negative sequence current is indicative of the fault. More preferably, the method additionally includes calculating an intrinsic motor negative sequence current based on at least some of the sequence components, and subtracting the intrinsic motor negative sequence current from the fault negative sequence current generated as described above to determine a modified fault negative sequence current. Notably, the method and apparatus are capable of detecting faults that cause a modified fault negative sequence current as low as approximately 0.2% of the full load current.

29 Claims, 4 Drawing Sheets

METHOD AND APPARATUS FOR MOTOR FAULT DIAGNOSIS

BACKGROUND OF THE INVENTION

1. Field of the Invention

The present invention is directed to a method and apparatus for detecting a fault in electrical motors and, more particularly, using a power decomposition technique (PDT) to derive positive and negative sequence components of motor signals (e.g., the three-phase voltage or current) to determine the existence of an induction motor stator winding fault.

2. Description of the Related Art

Many critical industrial and related processes require reliable operation of electric rotating machinery such as an induction motor. Notably, stator winding faults most often lead to motor failure relatively soon after the fault develops, certainly within hours, but more typically within tens of minutes, or even seconds. In the past, because computing power was so limited and because motor lifetime after development of the fault is so short, such faults were not monitored. However, with the ability of current technology to process data in a cost-effective fashion, improved methods can be developed in detecting such faults. As a result, common problems associated with unexpected machinery failure, including costly repair, failure to shut down a process in an orderly fashion, extended process downtime and health and safety problems, can be avoided given advance warning of impending failure.

Known systems and methods of analyzing motor behavior during abnormal conditions to detect and predict these conditions have been generally directed to detecting faults in the stator of the motor, as such faults typically are the most common type of electrical failure. Typically, the stator of an electric machine includes windings that may experience a short circuit leading to a fault condition. Such faults are a common source of failure in induction motors and can be the result of aging and deterioration of the stator insulation which may become partially conducting (thus causing short circuits in the windings) before breakdown of the motor occurs. A short circuit in one of the three-phase windings will show up as an imbalance in the three winding impedances. When being fed by a balanced main supply, the motor fault then causes an imbalance in the three-phase currents. This imbalance in the three-phase currents is indicative of a stator winding fault.

It is known that this imbalance may be analyzed in terms of an appearance of negative sequence current in the motor. More particularly, in a three-phase system, the peaks of the currents in each phase occur in time order, for example, a, b then c. In the event that the current peaks are unequal, those currents can be expressed as a combination of positive sequence current and negative sequence current. The negative sequence component is a small component of the current that peaks in the order, for example, a, c then b, such that if it were the only component of the current applied it would turn the motor in the opposite direction, as is conventionally understood. Notably, when a fault in the motor exists, the fault causes the peaks of the current in each phase to be unequal. By measuring the negative sequence current caused by the fault, winding deterioration can be detected and subsequent motor failure can be predicted. However, a problem with detecting the appearance of negative sequence current from the motor is that an unbalanced supply will also produce negative sequence current.

Detecting negative sequence current without accounting for the component of the negative sequence current due to the unbalanced supply, and other contributions to the measured negative sequence current, thoroughly limits any such system. Most remarkably, these systems typically are able to detect only relatively large stator faults. In particular, unless the stator fault produces a negative sequence current that is 20% or more of the load current, the faults likely will go undetected, because such negative sequence currents can be caused by supply unbalance alone. Notably, however, often times the short circuit fault occurs involving only a single turn coil of the winding, or a few turns. Such a fault will produce negative sequence currents as low as 0.2% of the full load current. To detect the appearance of negative sequence current in the motor due to the winding fault with precision, it would be desirable to separate the contributions to negative sequence current due to motor faults and system unbalance.

Known methods have used variation in effective negative sequence impedance of an induction motor to detect inter-turn short circuit faults. These methods have been extended to include accounting for the effect of residual negative sequence current due to intrinsic motor asymmetry. Nevertheless, such methods are severely limited due to complex processing required and the need to gather data for multiple supply cycles to detect stator faults that are responsible for producing relatively low negative sequence current. Because even a seemingly minor stator fault, e.g., a fault in a single winding turn, will still eventually lead to motor failure, there was a need for a system capable of detecting such faults.

Along these lines, the short circuit faults may occur intermittently in the first place, before arcing fuses the shorting conductors and makes the short circuit permanent. Intermittent shorts, although not continuous, will still lead to motor failure. Notably, these faults are very difficult to detect with known methods because the fault may not appear over many of the supply cycles, yet, as stated previously, multiple supply cycles of data are typically required to perform fault detection. Presently, there are no known methods for efficiently detecting intermittent short circuit faults in-the stator windings.

As a result a method and apparatus of on-line diagnostic monitoring was desired that will detect motor faults that produce relatively small magnitude negative sequence fault current. Furthermore, the process preferably will be capable of detecting intermittent short circuit faults to gain even more advanced early detection of potential motor failure.

SUMMARY OF THE INVENTION

The, preferred embodiment of the present invention utilizes a power decomposition technique (PDT) to derive positive and negative sequence components of arbitrary three-phase signals in the time domain to detect motor deterioration, e.g., in the stator of an induction motor. The effects of variation in load, supply voltage and voltage unbalance are accounted for by utilizing a recursive least squares method, in conjunction with the PDT, to characterize the associated variation in motor reactance and the attendant residual negative sequence current.

According to one aspect of the invention, a method of detecting a fault in an induction motor includes sampling signals from the motor and then deriving sequence components of at least some of the instantaneous signals using a power decomposition technique (PDT), one of the sequence components being a total negative sequence current component. In addition, the method includes calculating an expected negative sequence current based on at least some of the sequence components. Then, the method subtracts the expected negative sequence current from the total negative sequence current to determine a fault negative sequence current, wherein the fault negative sequence current is indicative of the fault.

According to another aspect of the invention, the method includes calculating an intrinsic motor negative sequence current based on at least some of the sequence components, and subtracting the intrinsic motor negative sequence current from the total negative sequence current generated as described above to determine a modified fault negative sequence current. Notably, the method and apparatus are capable of detecting faults that cause a modified fault negative sequence current as low as approximately 0.2% of the full load current.

According to a still further aspect of the invention, an apparatus for detecting a fault in an induction motor using a power decomposition technique (PDT) includes a data collecting circuit to collect three-phase instantaneous signals from the motor. In addition, the apparatus includes a processor that determines an expected negative sequence current based on the negative sequence impedance, determines, using PDT, a total negative sequence current based on at least some of the instantaneous signals, and the main power supply unbalance, and calculates a motor negative sequence current by subtracting the expected negative sequence current from the total negative sequence current, wherein the motor negative sequence,current is indicative of the fault.

These and other objects, advantages, and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

DETAILED DESCRIPTION OF THE PREFERRED EMBODIMENT

Figure 1:
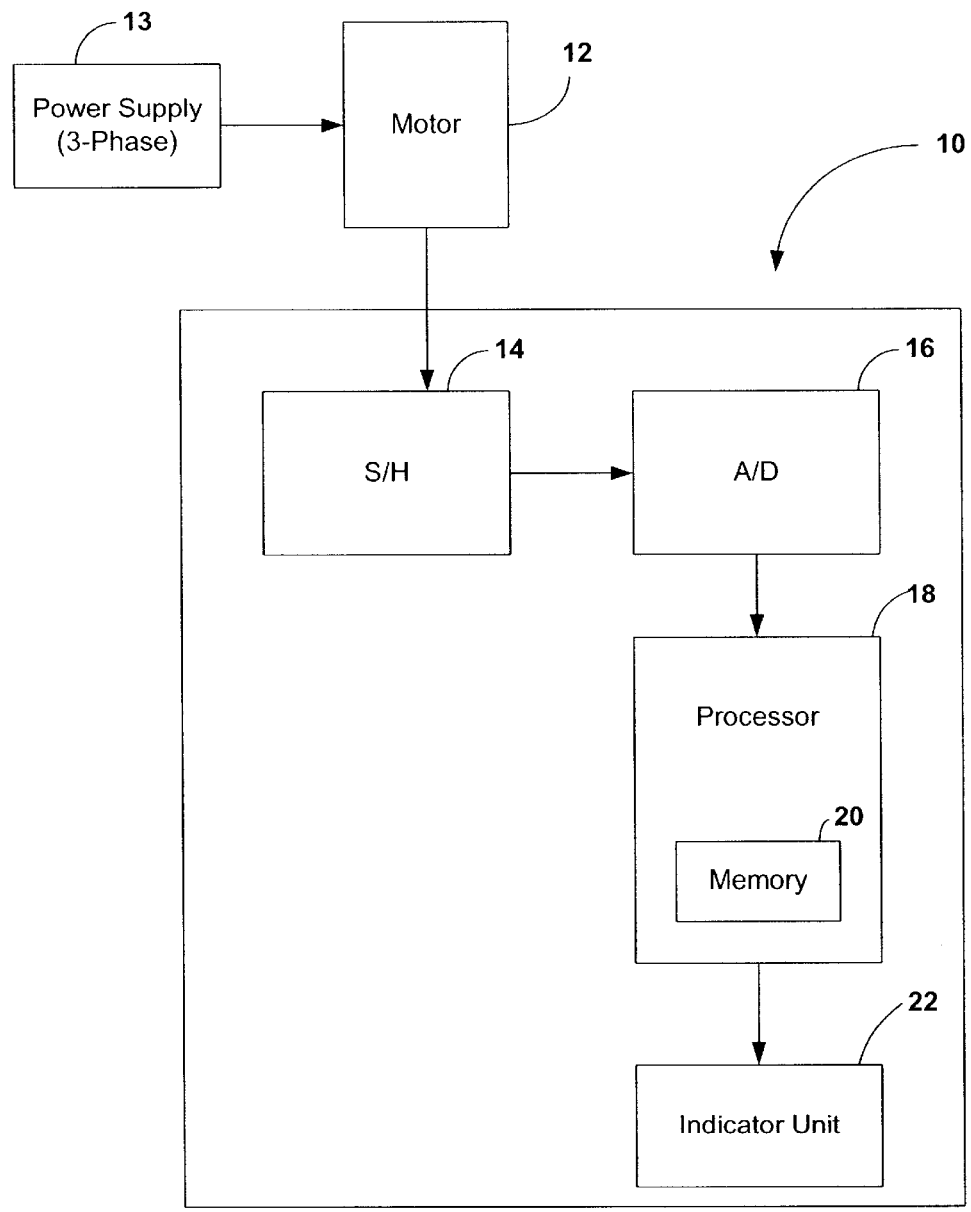
FIG. 1 is a block circuit diagram showing an on-line diagnostic monitoring system according to a preferred embodiment of the present invention.

Referring initially to FIG. 1, a system 10 for provident on-line diagnostic monitoring of a motor 12 powered by a three-phase supply 13 includes a data collecting circuit 14 (e.g., sample-and-hold circuit) that is adapted to receive instantaneous voltage and/or current signals from motor 12. In addition, system 10 includes at least one analog-to-digital converter 16 for digitizing the current and voltage signals to facilitate processing by a processor 18. Processor 18 includes a memory 20 having a power decomposition technique (PDT) algorithm embedded therein for deriving positive and negative sequence components of arbitrary three-phase signals in the time domain. Notably, by utilizing the PDT, system 10 is capable of determining whether a fault exists in the motor based on data collected from one cycle of the main supply. As a result, system 10 can detect a fault virtually immediately after it happens, notwithstanding that it may be intermittent (discussed below). Thus, system 10 minimizes the chance that a catastrophic event results. In addition, even if only one or a few turns of the windings are shorted, system 10 will detect the fault.

Processor 18 is also coupled to an indicator unit 22. Processor 18 analyzes the positive and negative sequence components according to the method to be described and generates a warning signal in response thereto. Indicator unit 22 is responsive to the warning signal to convey alert information regarding the health status of motor 12 to a user.

A. PDT Method for Determining Negative Sequence Current

Figure 2:
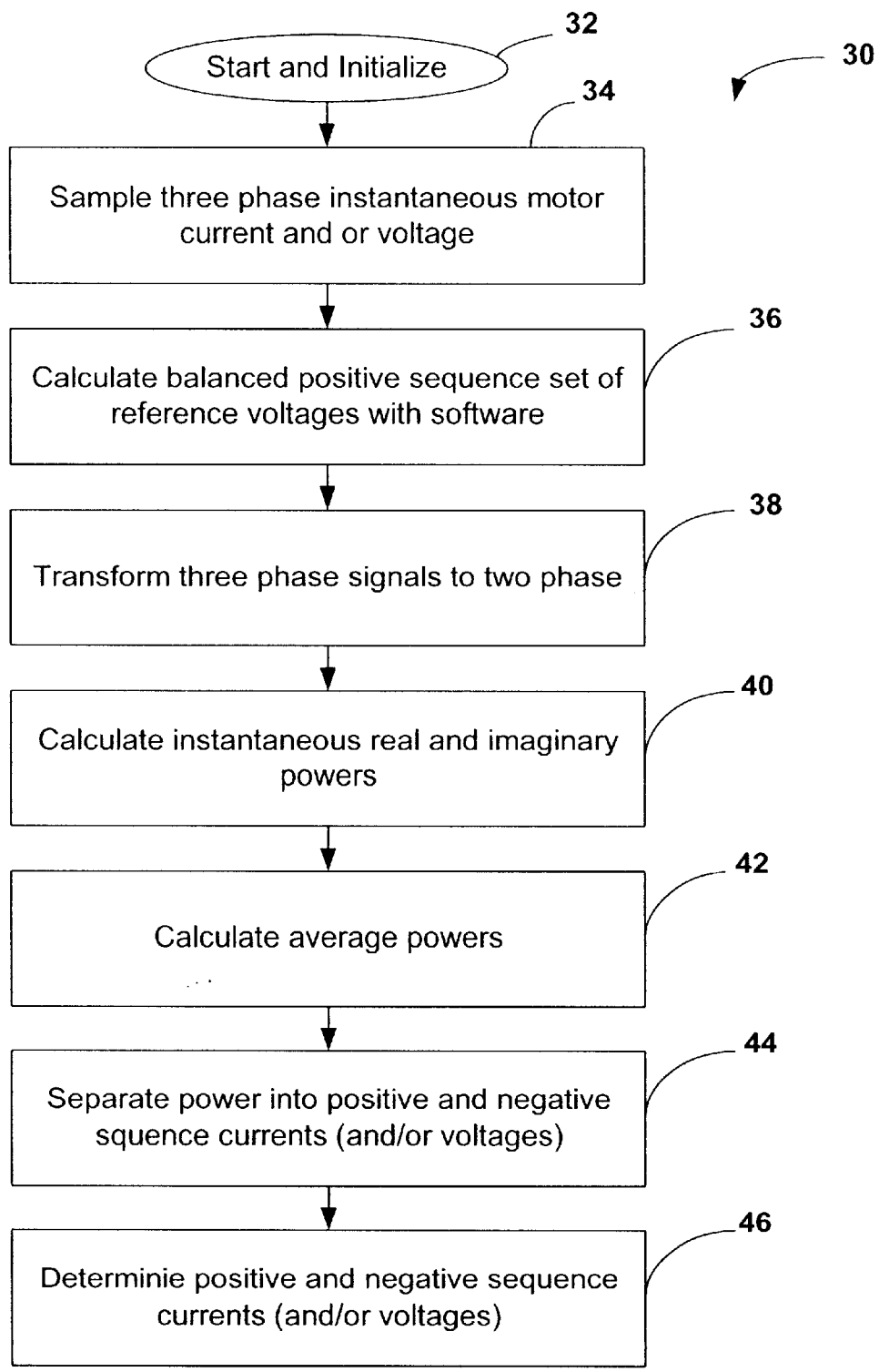
FIG. 2 is a flow diagram showing a preferred method of processing arbitrary three-phase signals according to the present invention.

Referring to FIG. 2, to measure the negative sequence components of the current in motor 12 according to PDT, a method 20 includes, after start-up and initialization at Step 32, sampling three-phase instantaneous current signals $i_a$, $i_b$, and $i_c$, and three-phase instantaneous line or phase voltages $v_a$, $v_b$, and $v_c$, at Step 34. It is also necessary to obtain, at Step 36, a balanced sinusoidal positive sequence set of reference voltages, $u_a$, $u_b$, and $u_c$ generated in software which are used as a reference.

The three-phase input currents are then transformed at Step 38 from three-to-two phase quantities by $$\begin{bmatrix} i_\alpha(t) \\ i_\beta(t) \end{bmatrix} = \frac{2}{3} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} i_a(t) \\ i_b(t) \\ i_c(t) \end{bmatrix} \qquad \text{Eqn. 1}$$

where the α and β suffixes refer to 2-axis orthogonal coordinates. For the reference voltages $$\begin{bmatrix} u_\alpha(t) \\ u_\beta(t) \end{bmatrix} = \frac{2}{3} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} u_a \\ u_b \\ u_c \end{bmatrix} \qquad \text{Eqn. 2}$$

The reference voltages $u_\alpha$ and $u_\beta$ in 2-dimensions are characterized by, $$u_\alpha(t) = U \cos(\omega t) \text{ and } u_\beta(t) = U \sin(\omega t) \qquad \text{Eqn. 3}$$

Note that U is the peak reference voltage and for convenience may be characterized as unity (U=1).

At Step 40, instantaneous real power and imaginary powers p(t) and q(t) are then calculated using $$\begin{bmatrix} p_\alpha(t) \\ p_\beta(t) \end{bmatrix} = \begin{bmatrix} u_\alpha(t) & 0 \\ 0 & u_\beta(t) \end{bmatrix} \begin{bmatrix} i_\alpha(t) \\ i_\beta(t) \end{bmatrix} \text{ and} \qquad \text{Eqn. 4}$$

$$\begin{bmatrix} q_\alpha(t) \\ q_\beta(t) \end{bmatrix} = \begin{bmatrix} -u_\beta(t) & 0 \\ 0 & u_\alpha(t) \end{bmatrix} \begin{bmatrix} i_\alpha(t) \\ i_\beta(t) \end{bmatrix} \qquad \text{Eqn. 5}$$

Preferably, the average value of these powers is then calculated at Step 42 over an integral number of cycles (one or more) of supply 13 using the equations $$\overline{p_\alpha(t)} = P_\alpha = \frac{1}{T}\int_0^T p_\alpha(t)\,dt \qquad \text{Eqn. 6}$$

$$\overline{p_\beta(t)} = P_\beta = \frac{1}{T}\int_0^T p_\beta(t)\,dt$$

$$\overline{q_\alpha(t)} = Q_\alpha = \frac{1}{T}\int_0^T q_\alpha(t)\,dt$$

$$\overline{q_\beta(t)} = Q_\beta = \frac{1}{T}\int_0^T q_\beta(t)\,dt$$

where T is the fundamental period, and P and Q are called the active and reactive power, respectively. Note that Step 42 may be performed over a single cycle and still provide reliable results, thus allowing the present apparatus and method to readily detect intermittent faults (described below).

At Step 44, these powers Pα, PβQα, Qβ, are divided into positive sequence power associated with the positive voltages and currents, and negative sequence power associated with negative sequence voltages and currents, on the appropriate axes. Note that subscripts 'p' and 'n' denote positive and negative sequence respectively.

For the positive sequence power in two phases, $$P^i_{\alpha p} = P_\alpha + P_\beta = P^i_{\beta p} \qquad \text{Eqn. 7}$$

$$Q^i_{\alpha p} = Q_\alpha + Q_\beta = Q^i_{\beta p}$$

while the negative sequence power is given by $$P^i_{\alpha n} = P_\alpha - P_\beta = -P^i_{\beta n} \qquad \text{Eqn. 8}$$

$$Q^i_{\alpha n} = Q_\alpha - Q_\beta = -Q^i_{\beta n}$$

The positive sequence currents $i_{\alpha_p}$ and $i_{\beta_p}$ are determined, in Step 46, according to $$\begin{bmatrix} i_{\alpha p} \\ i_{\beta p} \end{bmatrix} = \frac{1}{u_\alpha^2 + u_\beta^2}\begin{bmatrix} P^i_{\alpha p}\cdot u_\alpha - Q^i_{\alpha p}\cdot u_\beta \\ P^i_{\beta p}\cdot u_\beta + Q^i_{\beta p}\cdot u_\alpha \end{bmatrix} \qquad \text{Eqn. 9}$$

and the negative sequence currents $i_{\alpha_n}$ and $i_{\beta_p}$ are determined according to $$\begin{bmatrix} i_{\alpha n} \\ i_{\beta n} \end{bmatrix} = \frac{1}{u_\alpha^2 + u_\beta^2}\begin{bmatrix} P^i_{\alpha n}\cdot u_\alpha - Q^i_{\alpha n}\cdot u_\beta \\ P^i_{\beta n}\cdot u_\beta + Q^i_{\beta n}\cdot u_\alpha \end{bmatrix} \qquad \text{Eqn. 10}$$

Simultaneously with the current analysis, processor 18 can perform the same analysis with supply voltage samples in Step 46. In complex notation (x+jy), the sequence components are represented by the following eight values, $$I_n = (P^i_{\alpha n} + jQ^i_{\alpha n}) = I_{nx} + jI_{ny} \qquad \text{Eqn. 11}$$

$$I_p = (P^i_{\alpha p} + iQ^i_{\alpha p}) = I_{px} + jI_{py}$$

$$V_{sn} = (P^v_{\alpha n} + iQ^v_{\alpha n}) = V_{nx} + jV_{sny}$$

$$V_{sp} = (P^v_{\alpha p} + iQ^v_{\alpha p}) = V_{spx} + jV_{spy}$$

Note that if the reference signal has the same phase as the positive sequence voltage, the value of $V_{spy}$, will be zero.

Causing $V_{spy}$ to go to zero facilitates accurate acquisition of the negative sequence current. The phase angle $\phi_p$ of $V_{sp}$ can be used for that purpose. $\phi_p$ is given by $$\left(\phi_p = a\tan\left(\frac{V_{spy}}{V_{spx}}\right)\right) \qquad \text{Eqn. 12}$$

Then to use $V_{sp}$ as a reference phasor, all sequence components are multiplied by $(\exp(-j\phi_p))$.

B. Method of On-line Motor Fault Detection

Figure 3:
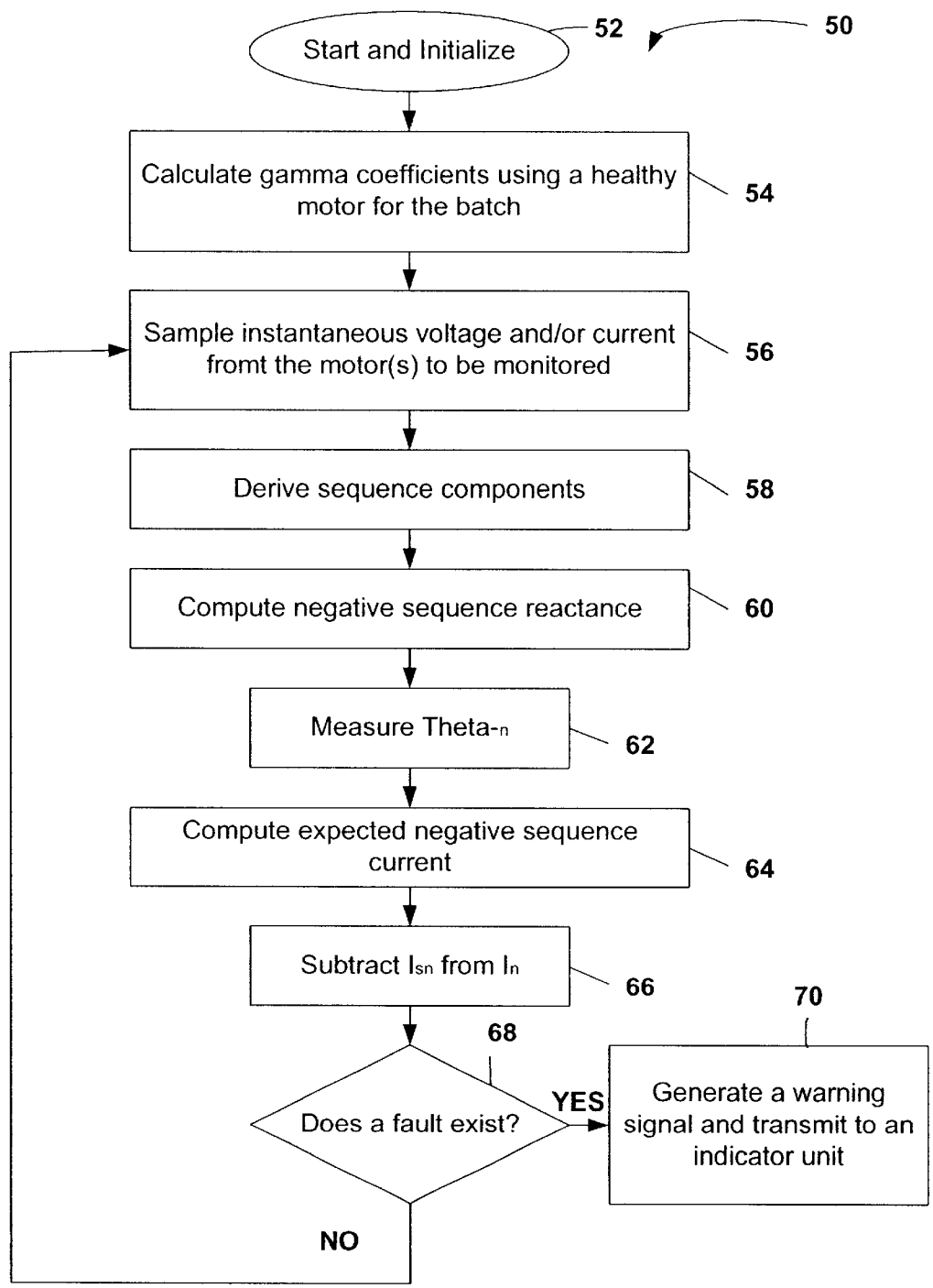
FIG. 3 is a flow diagram showing the operation of the system of FIG. 1, according to a preferred embodiment of the present invention.

Before turning to FIG. 3, to accurately detect motor faults and more particularly, to account for each component that contributes to the measured and computed negative sequence current $I_n$ (via the PDT), a formulation for the negative sequence current $I_{sn}$ due to an unbalanced supply has been developed using a healthy motor.

Notably, and more generally, it has been shown that in symmetrical systems the component of voltage and current of the different systems do not react with each other. Therefore, the sequence impedances are merely the ratio of the sequence voltage to the sequence current. As a result, for negative sequence impedance $Z_{hn}$, $I_n$ and $V_{sn}$ are processed such that the impedance can be characterized by the following equation, $$Z_{hn} = \frac{V_{sn}}{I_n} = \frac{V_{snx} + jV_{sny}}{I_{nx} + jI_{ny}} = R_{hn} + jX_{hn} \qquad \text{Eqn. 13}$$

In the presence of a fault, the observed negative sequence current $I_n$ is equal to the sum of a negative sequence current component $I_{sn}$ due to the voltage imbalance in the supply, $V_{sn}$, plus a component $I_{mn}$ arising from the stator winding fault. In other words, $$I_n = I_{sn} + I_{mn} \qquad \text{Eqn. 14}$$

As a result, the stator fault is associated with a fault current $I_{mn}$ given by, $$I_{mn} = I_n - I_{sn} \qquad \text{Eqn. 15}$$

Because for a healthy motor the negative sequence current associated with a stator fault is zero, $I_{sn}$ is equal to the measured negative sequence current $I_n$ and therefore can be characterized by, $$I_{sn} = \frac{V_{sn}}{Z_{hn}} \qquad \text{Eqn. 16}$$

The magnitude and phase of current component $I_{mn}$ is indicative of the unbalanced state of the stator due to, e.g., winding shorted circuited turns.

Notably, under operating conditions, changes in motor temperature will directly alter the resistive part ($R_{hn}$) of the negative sequence impedance $Z_{hn}$ and thus modify the value of the fault current of interest, $I_{mn}$. As the motor heats up, the resistive part of the negative sequence impedance $Z_{hn}$ is going to vary substantially. For example, if the motor heats up by a 100 degrees Celsius, the resistance of, e.g., the copper will change by approximately 40 percent. On the other hand, the reactive part $X_{hn}$ of the negative sequence impedance, $Z_{hn}$, is essentially inductive and merely depends on the geometry of the motor, a parameter that changes very little with temperature. Therefore, $X_{hn}$ is a much more stable quantity than the $Z_{hn}$. The present method and apparatus account for this thermal effect on the negative sequence impedance. To lessen the thermal effects on the calculated value of the negative sequence current due to supply imbalance, process 50 (FIG. 3) derives $I_{sn}$ using only the reactive part $X_{hn}$ of $Z_{hn}$.

The phase relation between the negative sequence voltage $V_{sn}$, and the expected negative sequence current $I_{sn}$ for a healthy motor is characterized by the current lagging behind the voltage by a phase angle $\phi_n$. $V_{sn}$ is given by, $$V_{sn} = I_{sn}R_n + jI_{sn}X_{hn} \qquad \text{Eqn. 17}$$

Therefore, the expected negative sequence current $I_{sn}$ for a healthy motor can be calculated according to, $$I_{sn} = \frac{V_{sn}\sin\theta_n}{X_{hn}} \qquad \text{Eqn. 18}$$

where $$\theta_n = a\tan\left(\frac{X_{hn}}{R_{hn}}\right)$$

and is measurable over each cycle.

The next step associated with accounting for the negative sequence current $I_{sn}$ generated by an unbalanced supply concerns determining $1/X_{hn}$ from Eqn. 18. Notably, the measured motor negative sequence reactance $X_{hn}$ is not constant, but varies with the amplitude of negative supply voltage $V_{sn}$ and with the orientation in of the unbalance. To account for this variation, the reactance $X_{hn}$ is characterized as follows, $$\frac{1}{X_{hn}} = \gamma_0 + \gamma_1 V_{sn} + \gamma_2 \sin(2\phi_n) + \gamma_3 \cos(2\phi_n) \qquad \text{Eqn. 19}$$

As a result, negative sequence current due to power supply imbalance can be determined and accounted for in assessing whether a fault exists, as described hereinbelow.

A preferred embodiment of the present motor fault detection method 50 will now be described in association with the flow chart depicted in FIG. 3. Initially, after start-up and initialization at Step 52, process 50 calculates the coefficients $\gamma_0$–$\gamma_3$ of negative sequence impedance $X_{hn}$ Step 54 based on data obtained from a known healthy motor from preferably, a batch of motors to be monitored. By using a presumably healthy motor (i.e., no existing faults), the method of the present invention assumes that any negative sequence current detected is due to an unbalanced supply. This assumption of a healthy motor is satisfactory due to the fact that, if the motor contains shorted turns it would fail very quickly.

To calculate the coefficients $\gamma_0$–$\gamma_3$, variac transformers are preferably used to produce increased voltage in either the a-, or b-, or c- phase of the three-phase stator windings. Also, the orientation of the direction of maximum voltage in the stator windings is determined by the angle $\phi_n$ of the negative sequence voltage $V_{sn}$. Process 50 conducts experiments with different amounts of voltage, load and imbalance, and, based on the data determines ideal values for coefficients $\gamma_0$, $\gamma_1$, $\gamma_2$ and $\gamma_3$ to relatively accurately account for varying negative sequence reactance $X_{hn}$ during motor operation. These coefficients preferably are computed using a recursive least squares fit. Ideally, the coefficients $\gamma_0$, $\gamma_1$, $\gamma_2$ and $\gamma_3$ are chosen such that $I_n - I_{sn} = 0$ for a healthy motor.

The recursive least squares method is based on the observed variation in $I_{sn}$ as data is collected in response to varying supply imbalance (in particular, $V_{sn}$, and $\phi_n$) for the healthy motor. Notably, the recursive least squares fit method does not require that a significant amount of memory be allocated to information storage. Further, this amount does not increase with time as more data points are used in the fitting process.

Note that the steps in 50 up to here (i.e., Steps 52 and 54)are a "characterization" of the motor. They are performed before using the algorithm for fault finding. Characterization, once completed, is not required again, for example, with regard to the associated batch of motors. The following steps are used repeatedly for fault finding.

After determining the coefficients associated with $X_{hn}$, i.e., characterizing the motor, process 50 samples voltage and instantaneous current signals from the motor(s) being monitored at Step 56. Thereafter values for positive sequence supply voltage $V_{sp}$, positive sequence current $I_p$, negative sequence supply voltage $V_{sn}$ and negative sequence current $I_n$ are derived, at Step 58, from the sampled data according to the PDT method described in Section A above.

At Step 60, $$\frac{1}{X_{hn}}$$

is computed according to Eqn. 19 for the set of instantaneous data. Having determined $$\frac{1}{X_{hn}}$$

process 50 measures $\theta_n$ at Step 62. Then, the associated expected negative sequence current $I_{sn}$ is computed according to Eqn. 18 at Step 64. By computing $I_{sn}$ in accordance with Eqn. 18, the present method obtains a very reliable determination of the negative sequence current due to supply imbalance.

To determine the negative sequence current due to a stator fault, process 50, at Step 66, subtracts the calculated $I_{sn}$ from the total measured negative sequence current $I_n$ (calculated using the PDT) according to Eqn. 15 for that cycle (or an integral number of cycles). Depending upon the calculated value for $I_{mn}$, process 50 determines whether or not a fault exists at Step 68. Because the gammas have been determined in advance, $I_{sn}$ will be approximately equal to $I_n$ if a fault does not exist, i.e., $I_{mn}$ will be approximately zero. In practicality, if the fault negative sequence current $I_{mn}$ is as small as 0.2% of the full load motor current, the fault will be detected. In the event that a fault is detected, processor 20 (FIG. 1), at Step 70, generates a warning signal and transmits the warning signal to indicator 20 which responds by notifying the user of the fault condition prior to the development of a hazardous and/or costly situation.

Further, the value obtained for the negative sequence current due to the fault $I_{mn}$ is indicative of the severity of the fault condition. Accordingly, an appropriate signal can be transmitted to the user to notify the user of the severity of the fault at Step 70. For example, the signal may indicate that motor 12 will be able to run without maintenance for an additional number of hours without causing the motor to fail. As a result, system 10, or the user, can intelligently determine when the motor should be shut down, thus minimizing unnecessary system downtime, yet preventing a hazardous breakdown.

Notably, another factor that contributes to the actual measured negative sequence current $I_n$ in motor 12 is a component attributable to intrinsic motor imbalance. A motor typically is not perfectly balanced when it is manufactured such that intrinsic motor imbalance is a characteristic of the motor. In particular, this imbalance may result from an unequal number of turns in each phase of the motor, the iron core of the motor not being isotropic, etc. In addition, changes in load can produce changes in the magnetic field pattern in motor 12, and cause changes in saturation at the slot tips of the stator (not shown). These changes modify the non-linear behavior of motor 12, and therefore produce a variation in a residual negative sequence current $I_{mnlv}$. Notably, $I_{mnlv}$ is present even in the absence of supply voltage unbalance (discussed above) when the load and supply voltage (i.e., positive sequence) are varied. This variation depends on positive sequence load and magnetizing currents, $I_{px}$ and $I_{py}$, respectively, derived in Step 58 and can be characterized by the following, $$I_{mnlv} = \beta 0 + \beta 1 I_{px} + \beta 2 I_{px}^2 + \beta 3 I_{py} + \beta 4 I_{py}^2 \qquad \text{Eqn. 20}$$

The coefficients $\beta_0$, $\beta_1$, $\beta_2$, $\beta_3$, and $\beta_4$ are constant parameters which are determined by utilizing the same recursive least squares fitting used to determine $\gamma_0$–$\gamma_3$. In particular, the variation in $I_{mnlv}$ is "fitted" as voltage and load are varied together using a known balanced power supply. By accounting for this intrinsic motor imbalance, even more sensitivity to negative sequence current generated by a motor fault is realized.

Figure 4:
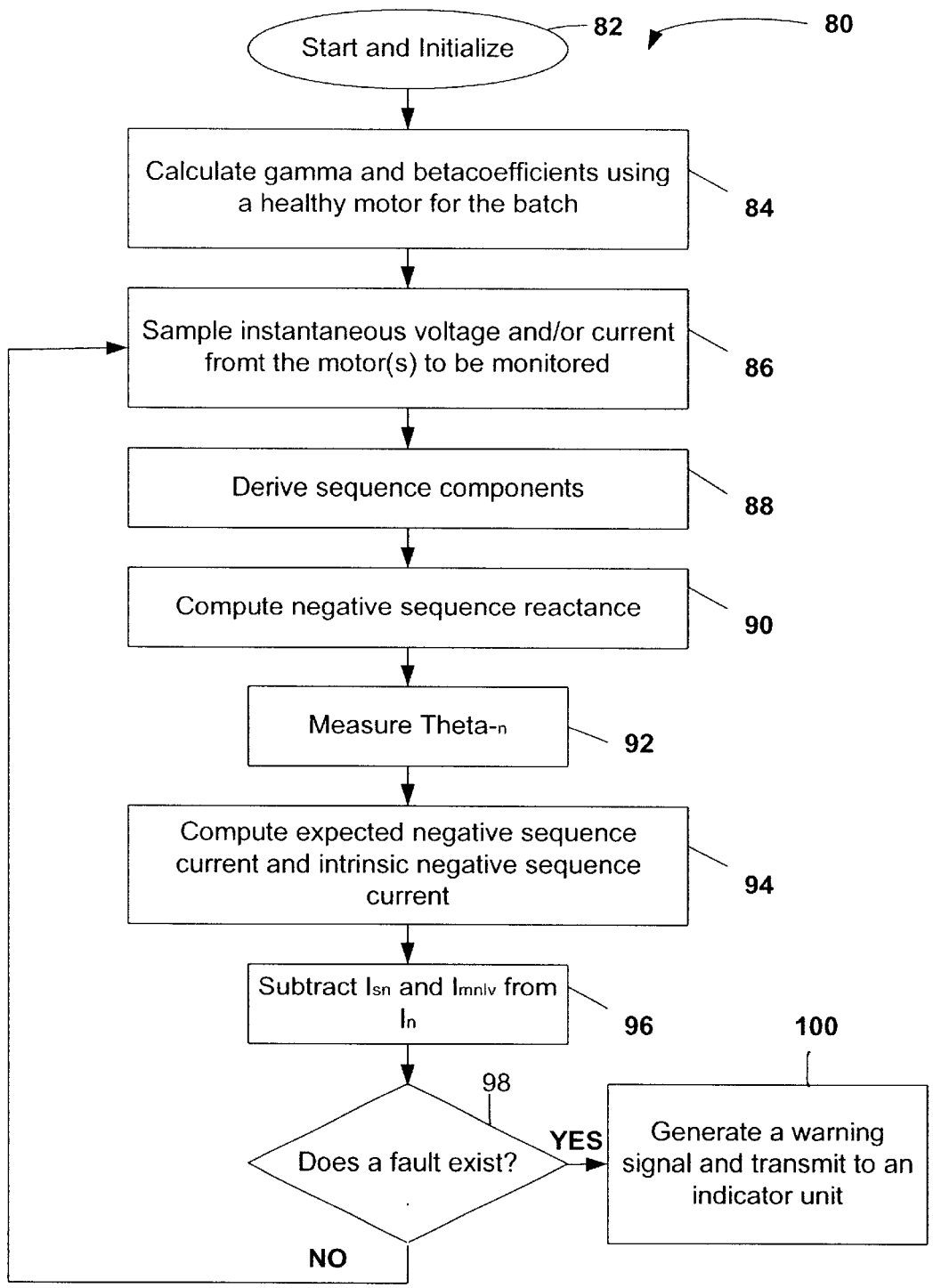
FIG. 4 is a flow diagram showing the operation of the system of FIG. 1, according to a more preferred embodiment of the present invention.

With reference to FIG. 4, a preferred process 80 for determining the negative sequence current caused by a fault is shown. Process 80 is similar to process 50 shown in FIG. 3, except that it computes and accounts for the negative sequence current generated by intrinsic motor imbalance. In particular, after start-up (Step 82), process 80, in addition to calculating the gammas for computing the negative sequence reactance, $1/X_{hn}$, calculates the betas of Eqn. 20 in Step 84. Similar to Steps 52 and 54 described above, the steps in 80 up to here (i.e., Steps 82 and 84) are a "characterization" of the motor. They are performed before using the algorithm for fault finding. Characterization, once completed, is not required again, for example, with respect to for the associated batch of motors. The following steps are used repeatedly for fault finding.

After sampling (Step 86), derivation of sequence components (Step 88), computation of negative sequence reactance $1/X_{hn}$ (Step 90), and measurement of $\theta_n$ (Step 92), process 80, in Step 94, computes both expected negative sequence current $I_{sn}$ and the residual or intrinsic negative sequence current, $I_{mnlv}$. Then, in Step 96, the difference between the measured negative sequence current, $I_n$, and both the expected and intrinsic negative sequence currents is computed to determine health of the motor. The remaining steps (Steps 98 & 100) correspond to Steps 68 & 70 in FIG. 3.

Therefore, to achieve precise detection of negative sequence current due to a fault in motor 12, preferred method 80 (FIG. 4) preferably compensates for supply unbalance current $I_{sn}$ obtained from equations 18 and 19, and the residual unbalance current $I_{mnlv}$ from equation 20. The negative sequence current associated with motor fault is therefore characterized by, $$I_{mn}^* = I_n - I_{sn} - I_{mnlv} \qquad \text{Eqn. 21}$$

wherein $I_n$ is the total measured negative sequence current.

Preferably, the above steps are performed on a batch basis selecting one healthy motor (of, for example, one hundred) to compute the $\gamma_0$–$\gamma_3$ and which determine how the negative sequence reactance $X_{hn}$ varies in Eqn. 19. Of course, each motor of the batch will preferably be run through a test to determine its general health (e.g., by testing one voltage/load data point), but each does not have to be tested by systematically varying the voltage load and unbalance over the full range used in determining the $\gamma_0$–$\gamma_3$.

Typically, motor data is sampled continuously and the PDT method computes the aforementioned values of interest (Eqn. 11) over an integral number of supply cycles. However, often times, a motor fault may exist even though it only appears sporadically when monitoring the motor, i.e., not continuously over an integral number of cycles. Such faults are called intermittent faults and are an indication of the early onset of motor failure, thus making such faults a significant concern.

The present method and apparatus is capable of detecting such faults because the PDT used requires only one supply cycle to obtain the values (Eqn. 11) necessary for calculating $I_{sn}$, and $I_{mnlv}$, i.e., to determine the existence of negative sequence current due to a motor fault, $I_{mn}$. As such, the present method and apparatus provide a system of early warning on-line diagnostics monitoring, thus facilitating prediction of motor failure and efficient planning of allocation and use of motor resources.

Preferably, methods 50 and 80, and apparatus 10 operate to sample signals (voltage or current) associated with each phase simultaneously (for example, using sample-and-hold circuit 14 to sample from each phase), wherein an analog-to-digital converter 16 is provided to process each signal. Alternatively, system 10 and methods 50 and 80 may employ non-simultaneous signal sampling of the three-phase variables, thus introducing a phase difference between sampled voltages (or currents) which depends on the delay between samples. With a delay angle of $\delta$ between samples, $V_{sp}$ and $V_{sn}$ (true values) can be derived from $\overline{V_{sp}}$ and $\overline{V_{sn}}$ (which are measured values uncompensated for non-simultaneous sampling as follows, $$V_{sn} = \overline{V}_{sn} e^{-j\delta} - \frac{\delta}{\sqrt{3}} \overline{V}_{sp} e^{-j\left(\frac{\pi}{3} + 2\delta\right)} \qquad \text{Eqn. 22}$$

$$V_{sp} = \overline{V}_{sp} e^{-j\delta} + \frac{\delta}{\sqrt{3}} \overline{V}_{sn} e^{j\left(\frac{\pi}{3} - 2\delta\right)} \qquad \text{Eqn. 23}$$

This processing eliminates all errors due to non-simultaneous sampling. Notably, the same procedure can be applied to positive and negative sequence currents.

Overall, the preferred embodiment of the present invention can detect negative sequence fault current in the supply lines which is as low as 0.2 percent of full load current, notwithstanding the presence of variation of load, voltage and unbalance. As a result, the method and apparatus can enable single turn short circuits (i.e., faults) to be detected in, for example, an induction motor. As discussed above, to achieve this sensitivity, motor characterization is carried out not only with respect to residual negative sequence current in a healthy motor, but also for motor variation of the negative sequence reactance, with different amounts of supply imbalance.

As an example, if a winding of motor 12 includes 500 turns only one of which is shorted, only 1/500th of the current will be affected. As a result, approximately 0.1% of full load current that is flowing as negative sequence current will be detected (although 1/500th of the current is 0.2%, because the negative sequence current is part of a three-phase current there is a factor of one-half that must be considered). In such a system, the 0.1% of full load current may be multiplied by three to become 0.3% current due to the rather high current flowing in the shorted turn, thus making the fault readily detectable even though its source is only a minimal short.

Notably, the healthy motor of the batch that is used to compute the gamma and beta coefficients of equations 19 and 20 can be monitored on-line as well. In this arrangement, the recursive least squares fitting algorithm used to establish the gamma and beta values can be included in the fault monitoring system, i.e., predetermination of the gamma and beta values is not required. The fitting algorithm must be employed while the motor is healthy and it should be noted that, to obtain reliable values for the coefficients, enough time must be allowed for data to be collected over a sufficiently wide range of variation in the load, voltage and supply unbalance. Once the system determines that the gamma and beta values have been established, the system can be automatically switched to perform fault detection according to the previously described method.

Many changes and modifications may be made to the invention without departing from the spirit thereof. The scope of the changes will become apparent from the appended claims.

What is claimed is:

1. A method of detecting a fault in an induction motor, the method comprising the steps of:

sampling signals from the motor;

deriving sequence components of at least some of the signals using a power decomposition technique (PDT), wherein one of the sequence components is a total negative sequence of current component;

calculating an expected negative sequence current based on at least some of the sequence components, wherein one of the sequence components is a reactive part of a negative sequence impedance, $(1/X_{hn})$;

determining a fault negative sequence current based on the expected negative sequence current; and wherein the negative sequence current is indicative of the fault.

2. A method of detecting a fault in an induction motor according to claim 1, further comprising the steps of:

calculating an intrinsic motor negative sequence current based on at least some of the sequence components, and subtracting the intrinsic motor negative sequence current from the fault negative sequence current to determine a modified fault negative sequence current, wherein the modified fault negative sequence current is indicative of the fault.

3. The method according to claim 1, wherein said sampling step is used to collect voltage signals and is performed for each phase non-simultaneously such that a phase difference between each of the sampled signals is created, and further comprising the step of compensating for the phase difference.

4. The method according to claim 3, wherein said compensating step includes using the following equations, $$V_{sn} = \overline{V}_{sn} e^{-j\delta} - \frac{\delta}{\sqrt{3}} \overline{V}_{sp} e^{-j(\frac{\pi}{3}+2\delta)}, \text{ and}$$

$$V_{sp} = \overline{V}_{sp} e^{-j\delta} + \frac{\delta}{\sqrt{3}} \overline{V}_{sn} e^{j(\frac{\pi}{3}-2\delta)}.$$

5. A method of detecting a fault in a motor by analyzing system negative sequence current, the method comprising the steps of:

determining an expected negative sequence current using a power decomposition technique (PDT), the expected negative sequence current being indicative of an imbalance in a three-phase power supply;

determining a system negative sequence current using the PDT and a reactive part of a negative sequence impedance, $(1/X_{hn})$;

determining a difference between the expected negative sequence current and the system negative sequence current, wherein the difference is indicative of the fault.

6. The method of claim 5, wherein said determining the expected negative sequence current step includes calculating a negative sequence impedance.

7. The method of claim 6, wherein the negative sequence impedance includes a resistive part and a reactive part, and said determining the expected negative sequence current step includes calculating based on the reactive part.

8. The method of claim 7, wherein the reactive part is characterized by the following equation:

$$\frac{1}{X_{hn}} = \gamma_0 + \gamma_1 V_{sn} + \gamma_2 \sin(2\phi_n) + \gamma_3 \cos(2\phi_n)$$

wherein $V_{sn}$ is a supply negative sequence voltage, $\phi_n$ is an orientation of the imbalance, and wherein $\gamma_0$, $\gamma_1$, $\gamma_2$, $\gamma_3$ are coefficients calculated using a healthy motor and a recursive least squares fit method.

9. The method of claim 8, wherein the expected negative sequence current is characterized by the following equation:

$$I_{sn} = \frac{V_{sn} \sin\theta_n}{X_{hn}}$$

wherein $\theta_n$ is a phase angle by which $I_{sn}$ lags behind $V_{sn}$.

10. The method of claim 5, further comprising the steps of:

determining an intrinsic motor negative sequence current using the PDT; and subtracting the intrinsic motor negative sequence current from the difference to determine a modified difference, wherein the modified difference is indicative of the fault.

11. The method of claim 10, wherein the intrinsic negative sequence current is determined based on the following equation, $$I_{mnlv} = \beta_0 + \beta_1 I_{px}^2 + \beta_3 I_{py} + \beta_4 I_{py}^2$$

wherein $I_{px}$ is a positive sequence active load current and $I_{py}$ is a positive sequence reactive magnetizing current, and wherein $\beta_0$, $\beta_1$, $\beta_2$, $\beta_3$, and $\beta_4$ are calculated using a healthy motor and according to a parameterization technique.

12. The method of claim 11, wherein the parameterization technique is a recursive least squares fit.

13. An apparatus for detecting a fault in an induction motor using a power decomposition technique (PDT), the apparatus comprising:

a data collecting circuit to collect three-phase signals from the motor, a processor that (1) determines a negative sequence impedance associated with an unbalanced power supply based on at least some of the instantaneous signals, (2) determines an expected negative sequence current based on the negative sequence impedance, (3) determines, using the PDT, a total negative sequence current based on at least some of the instantaneous signals components, wherein one of the instantaneous signal components is a reactive pan of a negative sequence impedance, $(1/X_{hn})$, and (4) calculates a motor negative sequence current based on the expected negative sequence current and the total negative sequence current;

wherein the negative sequence current is indicative of the fault.

14. The apparatus according to claim 13, wherein the negative sequence impedance includes a resistive part and a reactive part, and wherein said processor generates the expected negative sequence current in response to only the reactive part.

15. The apparatus according to claim 14, wherein said processor includes a memory having a recursive least squares fit algorithm stored therein, and wherein said processor uses said algorithm to determine gamma coefficients associated with the reactive part.

16. The apparatus according to claim 15, wherein said processor generates a warning signal indicative of the fault if the motor negative sequence current is greater than a threshold.

17. The apparatus according to claim 16, wherein the threshold is zero.

18. The apparatus according to claim 16, further comprising an indicator unit responsive to the warning signal to convey fault information to a user.

19. A method of detecting a fault in a motor using a power decomposition technique (PDT), the method comprising the steps of:

detecting three-phase motor current and generating corresponding signals; using the PDT to determine $I_n$, $I_p$, $V_{sn}$, and $V_{sp}$ in response to the signals, wherein $I_n$ is a negative sequence supply current, $I_p$ is a positive sequence supply current, $V_{sn}$ is a negative sequence supply voltage and $V_{sp}$ is a positive sequence supply voltage;

determining a reactive part $(1/X_{hn})$ of a negative sequence impedance based on at least some parameters of a group consisting of $I_n$, $I_p$, $V_{sn}$, and $V_{sp}$ and using the following equation $$\frac{1}{X_{hn}} = \gamma_0 + \gamma_1 V_{sn} + \gamma_2 \sin(2\phi_n) + \gamma_3 \cos(2\phi_n)$$

wherein $\phi_u$ is an orientation of negative sequence supply voltage $V_{sn}$ and wherein $\gamma_0$, $\gamma_1$, $\gamma_2$, $\gamma_3$ are determined using a healthy motor and a parameterization technique;

determining an expected negative sequence current $I_{sn}$ based on said using step and said determining a reactive part step; and calculating a fault negative sequence current by subtracting the $I_{sn}$ from the $I_n$.

20. The method of claim 19, wherein the expected negative sequence current $I_{sn}$ is equal to $$I_{sn} = \frac{V_{sn}\sin\theta_n}{X_{hn}}$$

wherein $\theta_n$ is a phase angle by which $I_{sn}$ lags $V_{sn}$.

21. The method of claim 19, further comprising the steps of:

determining an intrinsic motor negative sequence current based on at least some parameters of a group consisting of $I_n$, $I_p$, $V_{sn}$, and $V_{sp}$; and subtracting the intrinsic motor negative sequence current from the fault negative sequence current to determine a modified fault negative sequence current, wherein the modified fault negative sequence current is indicative of the fault.

22. The method of claim 21, wherein the intrinsic negative sequence current is characterized by the following equation:

$$I_{mnlv} = \beta_0 + \beta_1 I_{px} + \beta_2 I_{px}^2 + \beta_3 I_{py} + \beta_4 I_{py}^2$$

wherein $I_{px}$ is a positive sequence load current and $I_{py}$ is a positive sequence magnetizing current, and wherein $\gamma_0$, $\gamma_1$, $\gamma_2$, $\gamma_3$, and $\gamma_4$ are calculated using a healthy motor and according to a parameterization technique.

23. The method of claim 22, wherein the parameterization technique is a recursive least squares fit.

24. The method of claim 19, wherein said detecting step is performed for one supply cycle.

25. The method according to claim 19, further comprising the step of sampling three-phase motor voltage for each phase non-simultaneously such that a phase difference between each of the voltages is created, and further comprising the step of compensating for the phase difference.

26. The method according to claim 25, wherein said compensating step includes using the following equations, $$V_{sn} = \overline{V}_{sn}e^{-j\delta} - \frac{\delta}{\sqrt{3}}\overline{V}_{sp}e^{-j\left(\frac{\pi}{3}+2\delta\right)}, \text{ and}$$

$$V_{sp} = \overline{V}_{sp}e^{-j\delta} + \frac{\delta}{\sqrt{3}}\overline{V}_{sn}e^{-j\left(\frac{\pi}{3}-2\delta\right)}.$$

27. A method detecting an intermittent fault in a motor, the method comprising the steps of:

sampling, for each cycle of a power supply coupled to the motor, instantaneous signals from the motor;

deriving sequence components of at least some of the instantaneous signals using a power decomposition technique (PDT), wherein one of the sequence components is a total negative current component;

calculating an expected negative sequence current based on at least some of the sequence components, wherein one of the sequence components is a reactive part of a negative sequence impedance, $(1/X_{hn})$;

calculating an intrinsic motor negative sequence current based on at least some of the sequence components, and subtracting both the expected negative sequence current and the intrinsic motor negative sequence current from the total negative sequence current to determine a fault negative sequence current; and wherein the fault negative sequence current is indicative of the fault.

28. A method of detecting an intermittent fault in a motor, the method comprising the steps of:

detecting instantaneous three-phase motor current and generating corresponding signals;

using a PDT to determine $I_n$, $I_p$, $V_{sn}$, and $V_{sp}$ in response to the signals, wherein $I_n$ is a negative sequence supply current, $I_p$ is a positive sequence supply current, $V_{sn}$ is a negative sequence supply voltage and $V_{sp}$ is a positive sequence supply voltage;

determining a reactive part $(1/X_{hn})$ of a negative sequence impedance based on at least some parameters of the group consisting of $I_n$, Ip, and $V_{sn}$, and using the following equation, $$\frac{1}{X_{hn}} = \gamma_0 + \gamma_1 V_{sn} + \gamma_2 \sin(2\phi_n) + \gamma_3 \cos(2\phi_n)$$

wherein $\phi_u$ is an orientation of negative sequence supply voltage $V_{sn}$, and wherein $\gamma_0$, $\gamma_1$, $\gamma_2$, and $\gamma_3$ are determined while the motor is healthy and using a parameterization technique;

determining an expected negative sequence current $I_{sn}$ based on said using step and said determining a reactive part step; and calculating a fault negative sequence current by subtracting the $I_{sn}$ from the $I_n$.

29. A method of detecting a fault in an induction motor, the method comprising the steps of:

characterizing the motor using a healthy motor;

sampling signals from the motor;

deriving sequence components of at least some of the signals using a power decomposition technique (PDT)), wherein the sequence components comprise at least one of a total negative sequence current component and a reactive part of a negative sequence impedance, ($1/X_{hn}$);

determining a fault negative sequence current based on said characterizing step and the total negative sequence current; and wherein the fault negative sequence current is indicative of the fault.

* * * * *